(12) United States Patent
Unrein

(10) Patent No.: US 7,286,371 B2
(45) Date of Patent: Oct. 23, 2007

(54) ATTACHING HEAT SINKS TO PRINTED CIRCUIT BOARDS USING PRELOADED SPRING ASSEMBLIES

(75) Inventor: Ed Unrein, Surprise, AZ (US)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 11/089,495

(22) Filed: Mar. 24, 2005

(65) Prior Publication Data
US 2006/0215383 A1    Sep. 28, 2006

(51) Int. Cl.
H05K 7/02    (2006.01)
H05K 7/04    (2006.01)

(52) U.S. Cl. .................. 361/810; 361/807; 361/709

(58) Field of Classification Search .......... 361/807, 361/810, 701–702, 686–688, 709; 174/138
See application file for complete search history.

(56) References Cited

U.S. PATENT DOCUMENTS

| 5,201,451 A | * | 4/1993 | Desai et al. | 228/5.5 |
|---|---|---|---|---|
| 6,055,159 A | * | 4/2000 | Sun | 361/704 |
| 6,317,328 B1 | * | 11/2001 | Su | 361/704 |
| 6,404,646 B1 | * | 6/2002 | Tsai et al. | 361/758 |
| 6,545,879 B1 | * | 4/2003 | Goodwin | 361/807 |
| 6,687,129 B1 | * | 2/2004 | Wilson et al. | 361/730 |
| 6,826,054 B2 | * | 11/2004 | Liu | 361/719 |

OTHER PUBLICATIONS

Tran et al., U.S. Appl. No. 10/881,788, filed Jun. 30, 2004, entitled "Attaching Heat Sinks to Printed Cricuit Boards Using Preloaded Spring Assemblies".

* cited by examiner

Primary Examiner—Dean A. Reichard
Assistant Examiner—Hung S Bui
(74) Attorney, Agent, or Firm—Trop, Pruner & Hu, P.C.

(57) ABSTRACT

An integrated circuit assembly including a heat sink, a socket, a printed circuit board and a chassis to be held together under spring bias. The assembly may be secured together with less than 2 mm spanning between a printed circuit board and a chassis.

13 Claims, 3 Drawing Sheets

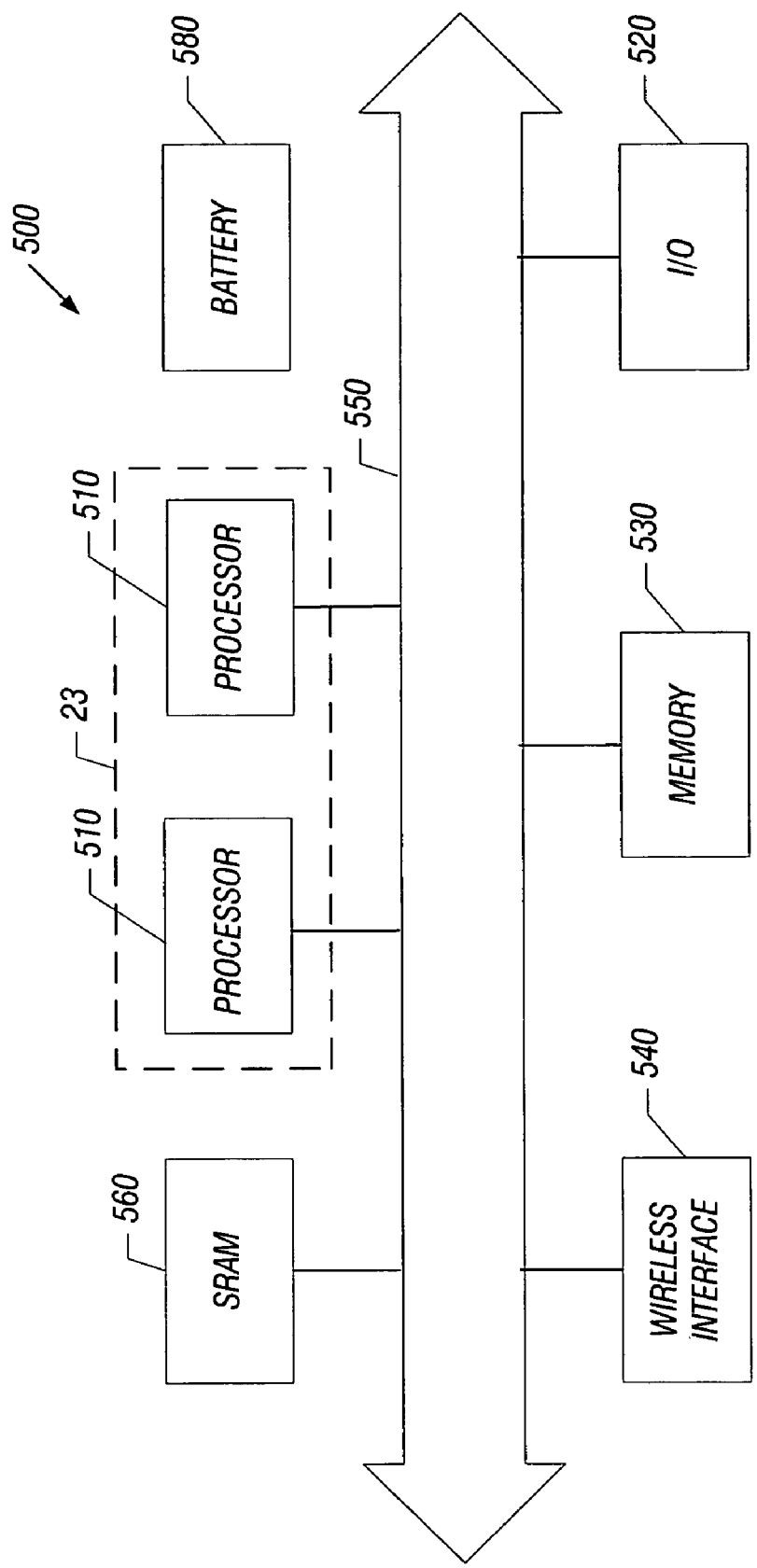

ATTACHING HEAT SINKS TO PRINTED CIRCUIT BOARDS USING PRELOADED SPRING ASSEMBLIES

BACKGROUND

This invention relates generally to securing heat sinks to printed circuit boards.

An integrated circuit may develop sufficient heat during operation that it needs to be cooled. To this end, finned heat sinks may be secured to integrated circuits for cooling purposes. Because the heat sinks tend to be heavy, they may be mounted directly to the printed circuit board on which the integrated circuit is also mounted.

The performance of integrated circuits, such as processors, is increasing. As their performance increases, the amount of heat integrated circuits generate may increase and this may result in the need for heat sinks of increasing size. Conventionally, a heat sink is mounted on the motherboard and the enabling load is applied from the heat sink side towards the chassis in what is called "top loading." One problem with top loading designs is that the printed circuit board may be bent downwardly by the enabling load. Excessive board deflection may be undesirable because it may result in solder joint cracking between board and board mounted components.

In a bottom loading design, the heat sink is mounted on the chassis and the enabling load is applied from below, from the chassis toward the heat sink.

One problem with bottom loading designs is that the printed circuit board may be bent upwardly by the enabling load. Excessive board deflection may be undesirable because it may result in solder joint cracking between board and board mounted components. In addition, in some designs, there may be relatively limited room between the printed circuit board and the chassis on which the printed circuit board is mounted. The bottom loading configuration must fit into whatever available space is provided.

Thus, there is a need for improved, bottom loading heat sink attachment solutions.

BRIEF DESCRIPTION OF THE DRAWINGS

FIG. 4 is a system in accordance with one embodiment.

DETAILED DESCRIPTION

Figure 1:
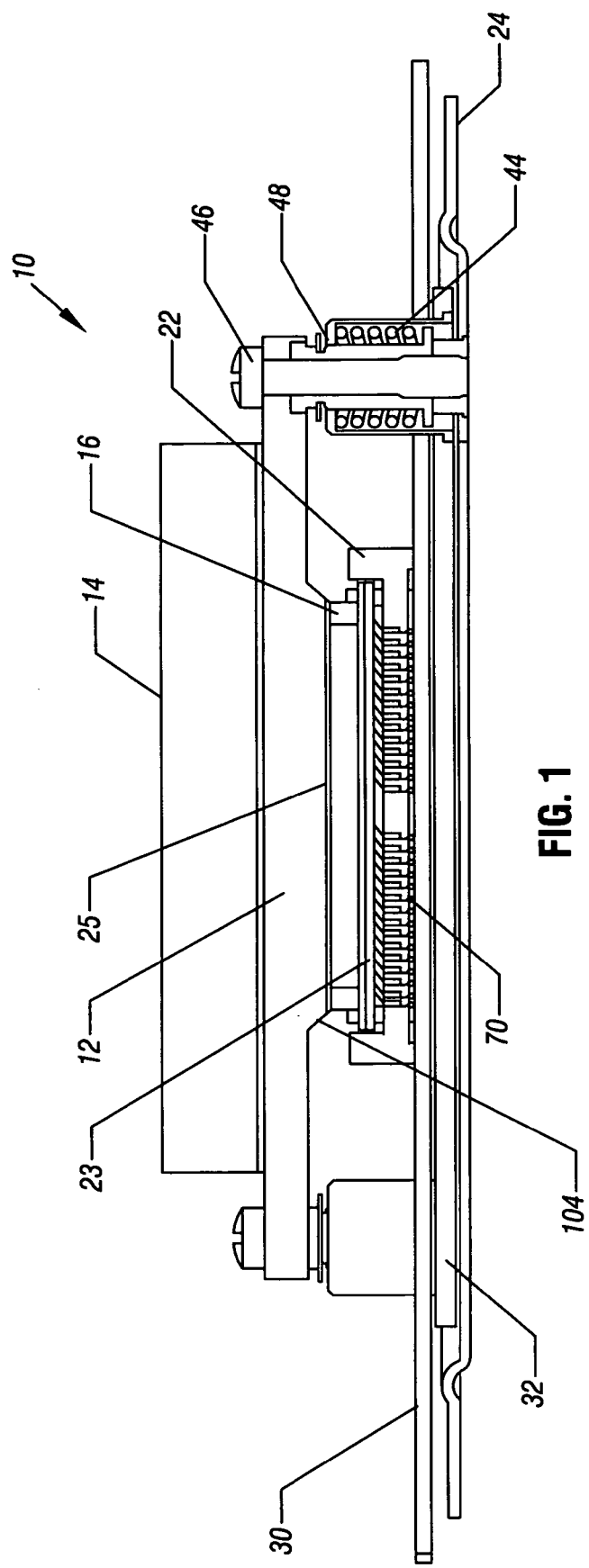
FIG. 1 is an enlarged, cross-sectional view of one embodiment of the present invention.

Referring to FIG. 1, an electronic device 10 may include a printed circuit board 30 and a chassis 24. The printed circuit board 30 may be a motherboard that receives an integrated circuit 23, such as a processor, in one embodiment. A socket 22 couples an integrated circuit 23 electrically and mechanically to the printed circuit board 30. A heat spreader 16 may distribute heat from the integrated circuit 23 though thermal interface material 25 to the heat sink base 12 and, ultimately, to heat sink fins 14 to reduce the temperature of the integrated circuit 23.

The heat sink base 12 constitutes a relatively rigid element. Also, the chassis 24 on the bottom is a relatively rigid lower element of the device 10. Other elements in between are clamped between these two rigid elements. The elements in between may include an integrated circuit 23, such as a single or multi-core processor die (not shown), die thermal interface material (not shown), the heat spreader 16, thermal interface material 25, an integrated circuit socket 22, a printed circuit board 30, and a lift plate 32. Thus, the amount of bending stress and load that is born by more delicate components, such as the integrated circuit 23, socket 22, and the printed circuit board 30, is relatively small and those forces and stresses may be applied statically and dynamically during shipping shock and vibration to those more delicate components so that damage to those components from bending and cracking may be reduced in some embodiments.

The socket 22 may include a plurality of spring contacts 34 extending therethrough. In one embodiment, the socket 22 may be a land grid array (LGA) socket with a solder ball grid array (BGA) interface to the printed circuit board 30. The LGA type socket 22 may use individual spring contacts 34a (FIG. 3) that provide an electrical interface to land grid array pads (not shown) on the underside of the integrated circuit 23. The individual spring contacts 34a may be vertically compressed and held closed to deliver power and input/output signals between the circuit board 30 and the integrated circuit 23. The BGA interface may include the solder balls 70, shown in FIG. 3. The solder balls 70 make connections between the contacts 34 and the printed circuit board 30. These solder balls 70 are prone to being damaged if the device 10 is subjected to excessive bending or other extreme loads.

In some cases, the integrated circuit 23 may include multi-core processors. While each of the processor cores themselves may be formed on relatively small dies, the inclusion of a number of such cores within one die may make the die much larger. The larger die is more subject to stresses, including bending. Thus, it would be desirable, particularly in the case of large die, to reduce those stresses applied to the die and to attempt to absorb those stresses through structural components such as the chassis 24, the lift plate 32, and the heat sink base 12.

The heat sink base 12 which may include a circular shaped pedestal 104 applies a downward force to press the integrated circuit 23 and the socket 22 together through a circular pedestal 104 in some embodiments of the present invention. Thus, a downward force may be applied through the circular pedestal 104, through thermal interface material 25, though the heat spreader 16 to the integrated circuit 23, which in turn is pressed against spring contact arms 34a and the socket 22.

From the bottom, upward force is applied to the lift plate 32 through the insulating ring 90, and the printed circuit board 30 at a region directly underneath the socket 22. As a result, force may be directly and more uniformly applied to the socket 22 and to the overlying components.

Figure 2:
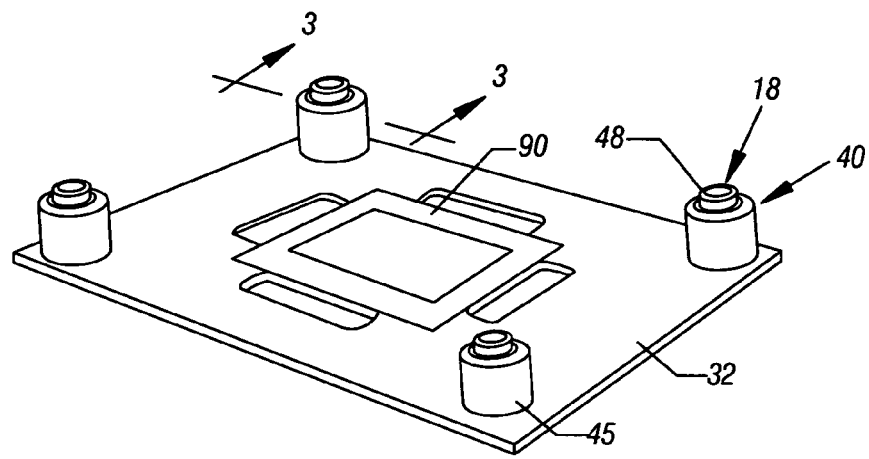
FIG. 2 is a perspective view of a preloaded spring assembly in accordance with one embodiment of the present invention.

In some embodiments, the gap "S" between the chassis 24 and the printed circuit board 30 may be as small as 2 millimeters. The reduction in this gap is particularly desirable in so-called thin blade server type platforms. Because of the reduced gap (thickness), the preloaded spring assemblies 40 are displaced to the corners of the lift plate 32 as shown in FIG. 2.

Figure 3:
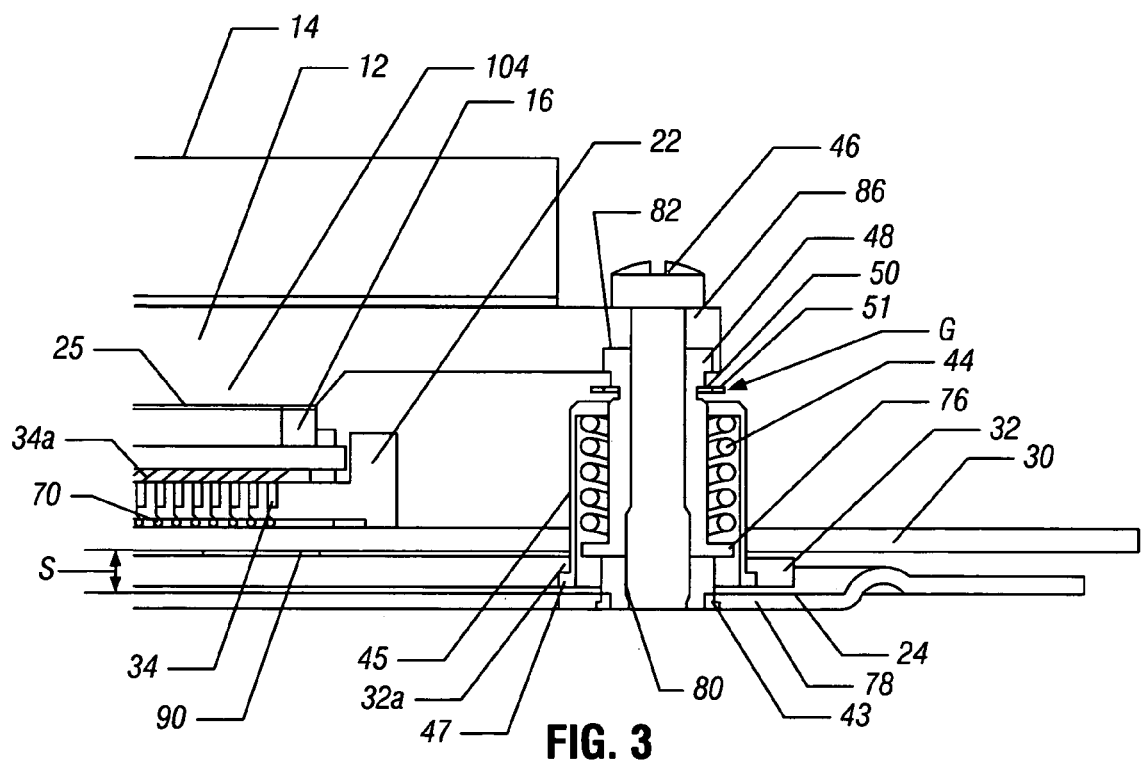
FIG. 3 is a partial, enlarged cross-sectional view of a portion of the embodiment of FIG. 1.

More particularly, a screw 46 threads through an opening 86 in the heat sink base 12 and extends downwardly to thread into a collar mount 43, as shown in FIG. 3. The collar mount 43 may, for example, be staked or crimped to the chassis 24. The collar mount 43 may be internally threaded so that a threaded connection 80 is made between the free end of the screw 46 and the collar mount 43.

Resting atop the collar mount 43 is a T-shaped standoff 48. The T-shaped standoff 48, on its upper end, is retained within a countersunk recess 82 in the heat sink base 12. On its lower end, the T-shaped standoff has extending arms 76 which actually physically abut with the collar mount 43. Thus, the screw 46 may extend concentrically through the T-shaped standoff 48 without threadingly engaging the standoff 48.

Concentrically surrounding the T-shaped standoff 48 is a coil spring 44. In the configuration shown in FIG. 1, the coil spring 44 has been compressed, for example, to about half of its normal height. In this configuration, it is applying a downward force to the arms 76 and an upward force to the inverted, cup-shaped housing 45 that surrounds the coil spring 44.

The coil spring 44 may advantageously provide a linear force. The coil spring 44 may have a characteristic of deflection versus force which is linear. This characteristic may result in the more uniform provision of forces to the floating components to compress them together. Again, the floating components may include the printed circuit board 30, the integrated circuit 23, the thermal interface material 25, and the socket 22. They may be considered to be floating since they are not fixed to either the heat sink base 12 or chassis 24 but, instead, are merely trapped between the base 12 and the chassis 24 and, more particularly, the lift plate 32.

The upward force supplied by the spring 44 is directed to an inside surface of the housing 45, pushing the housing 45 upwardly. The housing 45 has an outwardly extending lower lip 47 that engages a downwardly facing countersunk region 32a of the lift plate 32. In one embodiment, the lift 42 may be press fit to the region 32a. Thus, the upward force applied to the housing 45 ends up providing an upward force to the lift plate 32. This upward force is conveyed through the insulator ring 90 to the printed circuit board 30 onto the socket 22 and upwardly to the integrated circuit 23, heat spreader 16, thermal interface material 25. Ultimately, resistance is applied from above by the pedestal 104 which, in one embodiment, may be circular.

A circular groove 50 in the T-shaped standoff 48 retains a retaining ring 51. In the condition shown in FIGS. 1 and 3, the floating components are pressed together to form the operating stack. Prior to making up the operating stack, the retaining ring 51 prevents excessive upward displacement of the housing 45 and spring 44. In other words, the ring 51 ensures that the spring 44 is preloaded. This preloading may be advantageous in a number of ways. If the spring were not preloaded, upon assembly, a lot of rotating of the screw 46 would be needed to put the device 10 together. Perhaps more importantly, however, if the spring 44 were allowed to spring upwardly, it could be deflected during assembly because of its high aspect ratio. Such deflection may apply undesirable forces to sensitive components such as the printed circuit board 30.

For example, in some cases, multiple units of the type shown in FIG. 1 may be applied in multiple downset regions 78 of the chassis 24. While one device 10 is being assembled to the chassis 24 in a first downset region 78, if other springs were extending upwardly associated with other downset regions 78, accidental deflection of those springs could apply undesirable bending stresses to the printed circuit board 30.

The insulator ring 90 is effective to apply force at the right location under the socket 22. It is also effective to electrically insulate the printed circuit board 30 from the lift plate 32 which, in some embodiments, may be made of metal. The insulator ring 90 may be made about 15 mils thick, in one embodiment, and may be made of Kapton® polyamide.

In some embodiments, the gap "G" between the ring 51 and the housing 45 may be on the order of about a millimeter and, in some embodiments, may be less than 1 mm. The gap may be sufficient, in some embodiments, to take up the tolerance of the operating stack, before loading from the heat sink base 12 and lift plate 32, of the floating components.

An enabling load is applied to the heat sink base 12 via the preloaded spring assembly 40 and from the lift plate 32 underneath the printed circuit board 30, through the socket 22, integrated circuit 23, and heat spreader 16. In one embodiment the spacing "S" between the chassis 24 and the printed circuit board 30 is 2 mm. or less. The preloaded spring assemblies 40 may be particularly advantageous when the board 30 to chassis 24 gap is small, but bottom loading is still desirable. In some embodiments, all that is needed in the spacing S to apply bottom loading is the lift plate 32.

The enabling loading may be as high as 170 pounds, in some embodiments, to compress the integrated circuit 23 and socket 22 (including spring contacts 34a) against the heat sink base 12. The board 30 deflection may be limited as much as possible during assembly to prevent failures such as via or solder ball cracking.

It is also desirable to reduce the load variation under all dimensional stack up conditions. Regardless of spring installed height variation, the spring 44 load advantageously is as close to its designed value as possible. Excessive load may cause package failure, while an insufficient load does not guarantee full mating with socket contacts. In addition, compression contact sockets, such as land grid array sockets, require that the load be maintained throughout the life of the product. Loss of load due to plastic components (creep) and solder ball failure should be reduced if possible. Thus, the need to account for spring installed height variations and to maintain contact over the life of the spring, suggests that the spring contacts 34a should be made as soft as possible.

These conflicting goals can be accommodated by using relative linear coil springs and then preloading the coil springs 44 to a load level that is close to the design load value. For example, older cantilever spring and beam spring designs required a design load value of 170 lbf. This embodiment utilizing more linear coil springs and preloading can assure the spring contacts 34a can be loaded with only 140 lbf. Upon assembly the printed circuit board 30 only needs to deflect the spring contacts 34a by a small displacement which corresponds to the difference between the design load and the preload.

Older cantilever and beamspring may exhibit a wide variation of load over the thickness tolerance stack-up. The preloaded spring may maintain a minimum load, have less load variation due to thickness tolerance stack, and require minimum board deflection during installation, in some embodiments.

System 500, contained within the chassis 24, may include integrated circuit 23 including two processors 510, an input/output (I/O) device 520 (e.g. a keypad, display), a memory 530, and a wireless interface 540 coupled to each other via a bus 550. The system 500 may be implemented at least in part on the printed circuit board 30, and the system 500 may be mounted on the chassis 24. It should be noted that the scope of the present invention is not limited to embodiments having any or all of these components.

Integrated circuit 23 may comprise, for example, one or more microprocessors 510, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    spring biasing a lift plate towards a heat sink to compress an intervening socket against an integrated circuit while allowing a printed circuit board to float between the lift plate and the heat sink;
    enabling the spring biasing of said lift plate toward said heat sink to be adjusted by providing adjustment screws to enable adjustment of said spring bias;
    providing L-shaped standoffs on a chassis to enable said screws to be tightened within said standoffs; and
    abutting said standoffs against collar mounts secured to a chassis such that threading said screws increases the bias between the lift plate and said heat sink.

2. The method of claim 1 including providing a gap between said printed circuit board and a chassis of two millimeters or less.

3. The method of claim 1 including securing said lift plate to the heat sink through a plurality of threaded fasteners.

4. The method of claim 1 including enabling said integrated circuit, socket, and the printed circuit board to float between said heat sink and said lift plate.

5. The method of claim 4 including retaining said springs within a housing.

6. The method of claim 5 including securing said housing to said lift plate.

7. The method of claim 1 including preloading coil springs that bias said lift plate towards said heat sink.

8. A heat sink assembly comprising:
    a printed circuit board;
    a heat sink;
    a lift plate, said board floating between said lift plate and said heat sink;
    a plurality of preloaded spring assemblies to spring bias said lift plate and said heat sink together, said spring assemblies including screws extending through said heat sink;
    wherein said preloaded spring assemblies include a coil spring, an L-shaped standoff, and a housing, said housing and said standoff to constrain said coil spring;
    a screw which threads through said standoff to adjust the compression on said spring wherein said screws pass through said heat sink and said screws including retainers to engage said housings to preload said spring assemblies.

9. The assembly of claim 8 wherein said lift plate is mounted in a space of 2 millimeters or less, and said heat sink assembly is bottom loaded.

10. The assembly of claim 8 including an integrated circuit and socket that float between said heat sink and lift plate.

11. The assembly of claim 10 including a chassis with collar mounts threadingly receiving said screws.

12. The assembly of claim 8 wherein said assembly includes an integrated circuit and a socket secured to said integrated circuit between said printed circuit board and said heat sink.

13. The assembly of claim 12 wherein said spring assemblies are arranged at the corners of said lift plate.

* * * * *

UNITED STATES PATENT AND TRADEMARK OFFICE
CERTIFICATE OF CORRECTION

PATENT NO. : 7,286,371 B2
APPLICATION NO. : 11/089495
DATED : October 23, 2007
INVENTOR(S) : Ed Unrein It is certified that error appears in the above-identified patent and that said Letters Patent is hereby corrected as shown below:

Column 5:
Line 34, "a" should be --the--.

Signed and Sealed this

Eighteenth Day of March, 2008

JON W. DUDAS
*Director of the United States Patent and Trademark Office*